(12) United States Patent
Hassner et al.

(10) Patent No.: US 7,774,679 B2
(45) Date of Patent: Aug. 10, 2010

(54) TECHNIQUES FOR PERFORMING REDUCED COMPLEXITY GALOIS FIELD ARITHMETIC FOR CORRECTING ERRORS

(75) Inventors: Martin Hassner, Mountain View, CA (US); Vipul Srivastava, San Jose, CA (US); Kirk Hwang, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 956 days.

(21) Appl. No.: 11/058,596

(22) Filed: Feb. 14, 2005

(65) Prior Publication Data

US 2006/0195768 A1 Aug. 31, 2006

(51) Int. Cl.
*H03M 13/00* (2006.01)

(52) U.S. Cl. .......................... 714/758; 714/781; 714/48; 714/799; 714/E11.001; 714/E11.002; 714/E11.003; 714/E11.049; 708/492

(58) Field of Classification Search ................. 714/758, 714/781, 48, 799, E11.001, E11.002, E11.003, 714/E11.049; 708/892
See application file for complete search history.

(56) References Cited

U.S. PATENT DOCUMENTS

| 4,637,021 | A | * | 1/1987 | Shenton ...................... 714/756 |
| 5,502,665 | A | | 3/1996 | Im |
| 5,778,009 | A | * | 7/1998 | Fredrickson et al. ......... 714/752 |
| 5,812,438 | A | | 9/1998 | Lan et al. |
| 6,343,305 | B1 | | 1/2002 | Koc et al. |
| 6,701,336 | B1 | * | 3/2004 | Shen et al. ................... 708/492 |
| 6,776,344 | B2 | * | 8/2004 | Daniel et al. ........... 235/472.02 |
| 7,003,715 | B1 | * | 2/2006 | Thurston ..................... 714/782 |
| 7,133,889 | B2 | * | 11/2006 | Parthasarathy et al. ...... 708/492 |
| 2004/0078408 | A1 | | 4/2004 | Miller et al. |
| 2005/0213758 | A1 | * | 9/2005 | Lenstra et al. ................ 380/44 |

* cited by examiner

*Primary Examiner*—Scott T Baderman
*Assistant Examiner*—Enam Ahmed
(74) *Attorney, Agent, or Firm*—Townsend and Townsend and Crew LLP; Patrick Duncan

(57) ABSTRACT

Techniques are provided for performing Galois field arithmetic to detect errors in digital data stored on disks. Two 12-bit numbers or two 10-bit numbers are multiplied together in Galois field using tower arithmetic. In the 12-bit embodiment, a base field GF(2) is first extended to $GF(2^3)$, $GF(2^3)$ is extended to a first quadratic extension $GF(2^6)$, and $GF(2^6)$ is extended to a second quadratic extension $GF(2^{12})$. In the 10-bit embodiment, the base field GF(2) is first extended to $GF(2^5)$, and $GF(2^5)$ is extended to a quadratic extension $GF(2^{10})$. Each of the extensions for the 10-bit and 12-bit embodiments is performed using an irreducible polynomial. All of the polynomials used to generate the first and the second quadratic extensions of the Galois field are in the form $x^2+x+K$, where K is an element of the ground field whose absolute trace equals 1.

8 Claims, 8 Drawing Sheets

TECHNIQUES FOR PERFORMING REDUCED COMPLEXITY GALOIS FIELD ARITHMETIC FOR CORRECTING ERRORS

BACKGROUND OF THE INVENTION

The present invention relates to techniques for performing reduced complexity Galois field arithmetic for correcting errors, and more particularly, to techniques for performing Galois field arithmetic using tower arithmetic that provides reduced complexity and reduced computational latency.

Errors in digital signals can be generated before the digital signals are stored on a data storage disk. Therefore, disk drives typically have error correction encoders. A Reed-Solomon (RS) encoder is one type of error correction encoder. An RS encoder generates error correction code (ECC) check bytes and cyclic redundancy check (CRC) bytes.

The ECC and CRC check bytes are used to detect errors and to correct errors in the data bytes using well known encoding processes. The RS encoder inserts ECC and CRC check bytes into the data stream before the data is written onto a disk. After data is read from the disk, an RS decoder uses the ECC and CRC check bytes to detect and correct errors in the data. Encoding and decoding of error correction codes is performed using arithmetical theories relating to Galois fields.

Many techniques for performing Galois field arithmetic in the context of error correction have been disclosed. For example, one prior art technique described in U.S. Pat. No. 5,502,665 relates to a method for performing Galois field multiplication. This technique requires a high degree of hardware complexity and requires a significant amount of computational latency. As a result, there is a need for performing Galois field arithmetic in a way that requires less hardware complexity and that has less computational latency.

BRIEF SUMMARY OF THE INVENTION

The present invention provides techniques for performing Galois field arithmetic to detect errors in digital data stored on disks and other data storage media. According to embodiments of the present invention, two 12-bit numbers or two 10-bit numbers are multiplied together in Galois field using tower arithmetic.

In the 12-bit embodiment, a base field GF(2) is first extended to $GF(2^3)$, $GF(2^3)$ is extended to a first quadratic extension $GF(2^6)$, and $GF(2^6)$ is extended to a second quadratic extension $GF(2^{12})$. Each of the extensions for the 12-bit embodiment is performed using an irreducible primitive polynomial. For the 12-bit embodiment, there are two irreducible polynomials ($x^3+x+1$ and $x^3+x^2+1$) that generate $GF(2^3)$.

In the 10-bit embodiment, the base field GF(2) is first extended to $GF(2^5)$, and $GF(2^5)$ is extended to a quadratic extension $GF(2^{10})$. Each of the extensions for the 10-bit embodiment is performed using an irreducible primitive polynomial. For the 10-bit embodiment, there are 6 irreducible primitive polynomials that generate $GF(2^5)$. This list of 6 polynomials includes $x^5+x^2+1$; $x^5+x^3+1$; $x^5+x^3+x^2+x+1$; $x^5+x^4+x^2+x+1$; $x^5+x^4+x^3+x+1$; and $x^5+x^4+x^3+x^2+1$.

All of the polynomials used to generate the first and the second quadratic extensions of the Galois field are in the form $x^2+x+K$. The absolute trace of all the elements of the ground field can be calculated over GF(2). The values of the absolute trace can be 0 or 1. K is an element of the ground field whose absolute trace equals 1.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
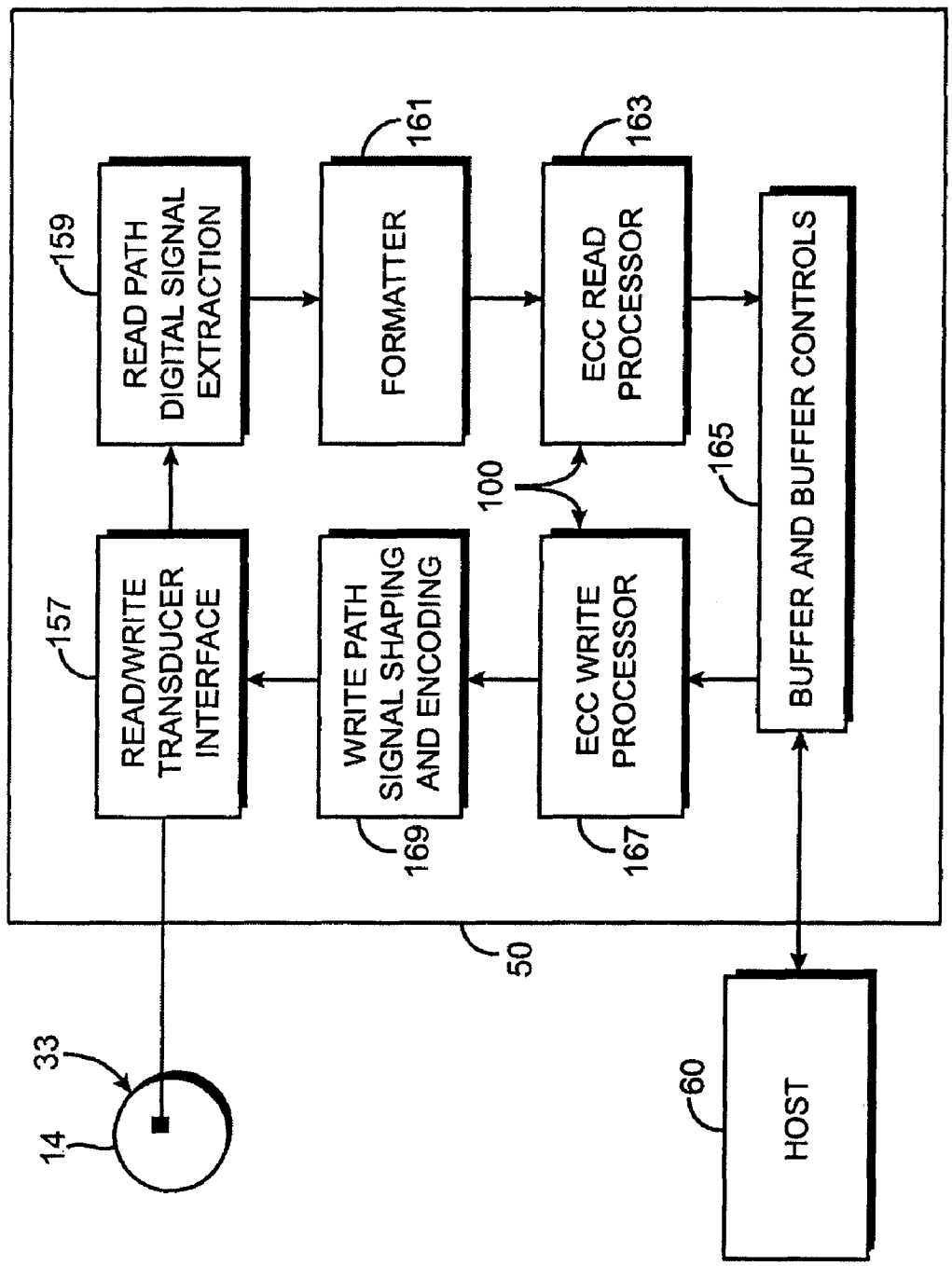
FIG. 1A is a block diagram detailing the architecture of a buffered hard disk drive controller that includes an on-the-fly error correction code (ECC) system for implementing on-the-fly error correction code.
Figure 1B:
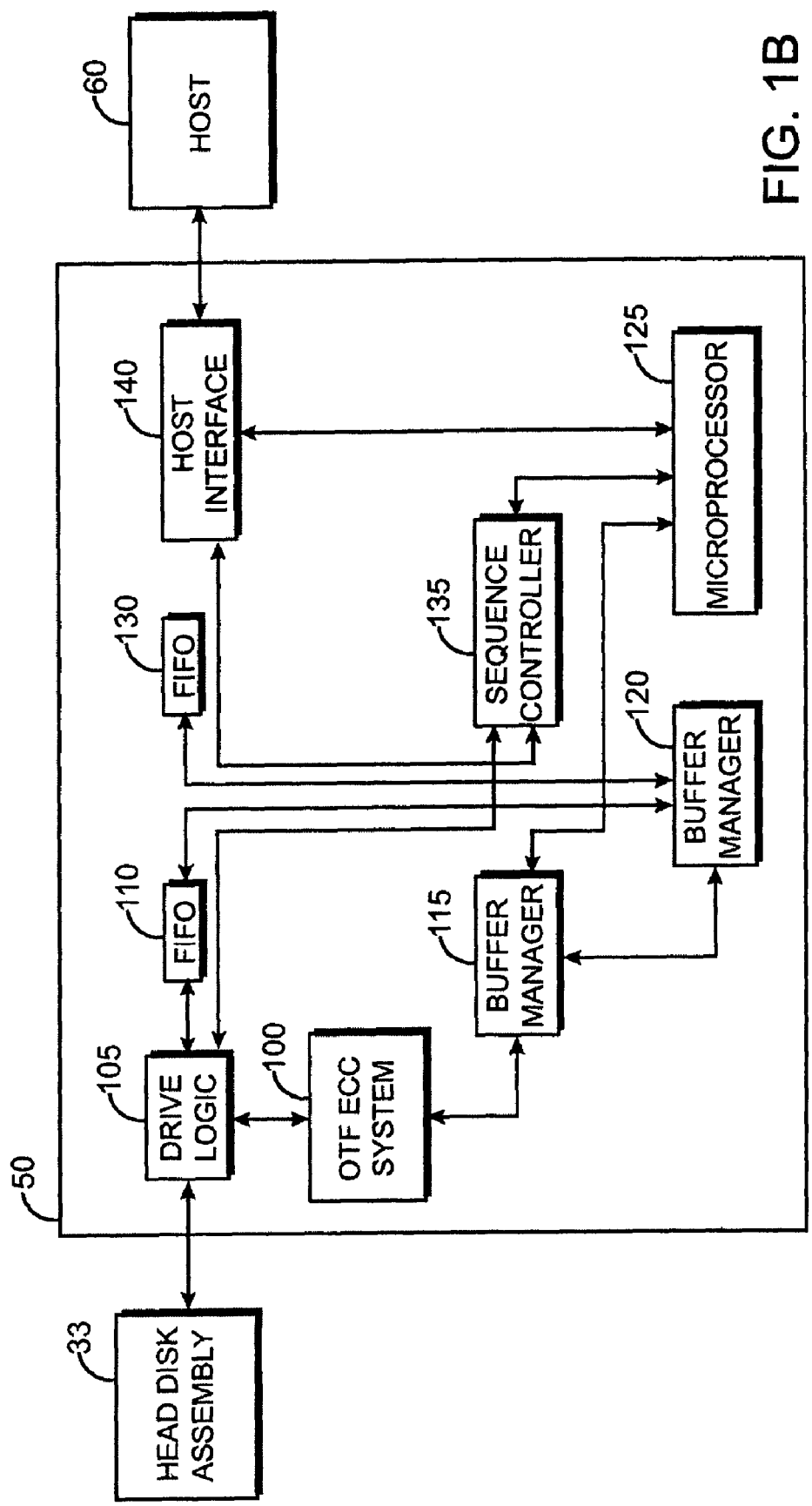
FIG. 1B is a block diagram of a data storage system depicting data flow along a read channel and a write channel of the hard disk drive controller of FIG. 1A.

FIGS. 1A and 1B illustrate an example of a hard disk drive control system for reading and writing data onto a magnetic hard disk. The hard disk drive control system of FIGS. 1A-1B is an example of hard disk drive system that can implement techniques of the present invention. The hard disk drive system of FIGS. 1A-1B can detect and correct errors in the data read from a disk.

FIG. 1A illustrates an exemplary architecture of a buffered hard disk drive controller 50. Hard disk drive controller 50 is configured to read data from and write data to a magnetic hard disk 14. Controller 50 includes an on-the-fly error correction code (ECC) system 100 for implementing an on-the-fly error correction code. On-the-fly error correction code system 100 includes an ECC read processor 163 and an ECC write processor 167.

FIG. 1B is a block diagram of the hard disk drive controller 50 of FIG. 1A that includes an on-the-fly error correction code system 100. When sequences of digital binary data are to be written onto the disk 14, they are placed temporarily in a buffer 165 shown in FIG. 1A and subsequently processed and transduced along a write path or channel (167, 169, and 157).

The hard disk drive controller 50 includes a logic drive circuit 105 shown in FIG. 1B that formats data from hard disk assembly 33, for example from 8 bits to 32 bits. A disk assembly 33 is comprised of disk 14 and a head stack assembly including a spindle motor. A FIFO register 110 stores the formatted data and exchanges the same with a sector buffer

120. The ECC system 100 receives the formatted data from the drive logic circuit 105 and performs an error correction coding algorithm. ECC system 100 can also perform the techniques and processes of the present invention, which are discussed in detail below.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

First, a predetermined number of binary data elements, also termed bytes, in a data string are moved from the buffer 165 and streamed through an ECC write processor 167. In the ECC write processor 167, the data bytes are mapped into codewords drawn from a suitable linear block or cyclic code such as a Reed-Solomon code. Next, each codeword is mapped in a write path signal-shaping unit 169 into a run length limited or other bandpass or spectral-shaping code and changed into a time-varying signal. The time-varying signal is applied through an interface read/write transducer interface 157 and then to the write element in a magneto resistive (or other suitable transducer head) for conversion into magnetic flux patterns.

All of the measures starting from the movement of the binary data elements from buffer 165 until the magnetic flux patterns are written on a selected disk track as the rotating disk 14 passes under the read/write head are synchronous and streamed. For purposes of efficient data transfer, the data is de-staged (written out) or staged (read) a codeword at a time.

Thus, both the mapping of binary data into Reed-Solomon codewords and the conversion to flux producing time-varying signals must be done well within the time interval defining a unit of recording track length moving under the transducer. Typical units of recording track length are equal fixed-length byte codewords of 512 bytes.

When sequences of magnetic flux patterns are to be read from the disk 14, they are processed in a read path or channel (157, 159, 161, and 163) and written into the buffer 165. The time-varying signals sensed by a transducer are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 161.

Because the read path is evaluating sequences of Reed-Solomon codewords previously recorded on the disk 14, absent error or erasure, the codewords should be the same. In order to test whether that is the case, each codeword is applied to an ECC read processor 163 over a path from a formatter 161.

Also, the output from the ECC processor 163 is written into buffer 165. The read path also operates in a synchronous data-streaming manner such that any detected errors must be located and corrected within the codeword well in time for the ECC read processor 163 to receive the next codeword read from the disk track. The buffer 165 and the read and write channels may be monitored and controlled by the microprocessor 125 to ensure efficacy where patterns of referencing may dictate that a path not be taken down, such as sequential read referencing.

As discussed above, Galois field arithmetic is performed by disk drive controllers to calculate the location of errors in digital data using error correction check bytes. The present invention provides techniques for performing Galois field arithmetic that require less hardware complexity and have less computational latency than many prior art techniques. Embodiments of the present invention will now be discussed in detail.

A Galois field $GF(2^m)$ is a set that contains a finite number of elements, where m is a positive integer. According to embodiments of the present invention, two 12-bit numbers or two 10-bit numbers are multiplied together in Galois field to generate a result. The result can be used to calculate error detection values or for other applications.

According to the present invention, Galois field arithmetic is performed using tower arithmetic. Tower arithmetic involves generating the Galois field using irreducible quadratic polynomials. An irreducible polynomial is a Galois field polynomial that does not factor in the ground field. In other words, the polynomial's roots are not in the ground field.

Both the 10-bit and the 12-bit embodiments begin with a base Galois field $GF(2)$. In the 12-bit embodiment, the base field $GF(2)$ is first extended to $GF(2^3)$ using an irreducible polynomial. $GF(2^3)$ is extended to a first quadratic extension $GF(2^6)$ using an irreducible polynomial. $GF(2^6)$ is extended to a second quadratic extension $GF(2^2)$ using a irreducible polynomial. The three extensions are represented as $GF(2)$-$GF(2^3)$-$GF(2^6)$-$GF(2^{12})$.

In the 10-bit embodiment, the base field $GF(2)$ is first extended to $GF(2^5)$ using an irreducible polynomial. $GF(2^5)$ is extended to a quadratic extension $GF(2^{10})$ using an irreducible polynomial. The two extensions are represented as $GF(2)$-$GF(2^5)$-$GF(2^{10})$.

According to the present invention, all of the polynomials used to generate the first and the second quadratic extensions of the Galois field are in the form, $x^2+x+K$, where K is an element in the ground field whose absolute trace equals 1. Given a ground field, the absolute trace of all its elements can be calculated over $GF(2)$. The values can be 0 or 1. Any element K whose absolute trace=1 can be used in $x^2+x+K$.

A finite extension $F=\mathbb{F}_q m$ of the finite field $K=\mathbb{F}_q$ is a vector space over K. F has dimension m over K, and $\{\alpha_1, \ldots, \alpha_m\}$ is a basis of F over K. For $\alpha \in F=\mathbb{F}_q m$ and $F=\mathbb{F}_q$, the trace of $\mathrm{Tr}_{F/K}(\alpha)$ over K is defined by equation (1).

$$Tr_{F/K}(\alpha) = \alpha + \alpha^q + \ldots + \alpha^{q^{m-1}} \quad (1)$$

If K is the prime subfield of F, then $\mathrm{Tr}_{F/K}(\alpha)$ is called the absolute trace of α and simply denoted by $\mathrm{Tr}_F(\alpha)$. In other words, the trace of α over K is the sum of the conjugates of α with respect to K.

In the 12-bit embodiment, there are 2 irreducible primitive polynomials that generate $GF(2^3)$. This list of 2 polynomials includes $x^3+x+1$ and $x^3+x^2+1$.

Thus, the Galois field $GF(2^3)$ can be generated from $GF(2)$ using a generator "a" that is a root of $a^3+a+1=0$. The first quadratic extension $GF(2^6)$ is calculated as follows. There are 4 $GF(2^6)$ generators over $GF(2^3)$ that correspond to all of the polynomials $b^2+b+a^i$, where $\mathrm{trace}(a^i)=1$. The values for $a^i$ are selected from the list of $\{\mathrm{trace}(a^i), i=0, \ldots, 6\}=[1, 0, 0, 1, 0, 1, 1]$. There are 4 nonzero 1 values in this list. Each nonzero value in the list corresponds to a power $a^i$ to generate a list of 4 irreducible quadratic polynomials defined in $GF(2^3)$ that are shown in Table 1.

TABLE 1

$b^2 + b + 1$
$b^2 + b + a^3$
$b^2 + b + a^5$
$b^2 + b + a^6$

The second quadratic extension $GF(2^{12})$ is calculated as follows. There are 32 $GF(2^{12})$ generators over $GF(2^6)$ that correspond to all of the polynomials $c^2+c+b^i$, where the trace (trace($b^i$))=1. The values for $b^i$ are selected from the list of {trace(trace($b^i$), i=0, . . . , 62}=[0, 1, 1, 0, 1, 1, 0, 0, 1, 0, 1, 1, 0, 1, 0, 1, 1, 1, 0, 1, 1, 1, 1, 0, 0, 1, 1, 0, 0, 0, 1, 0, 1, 0, 1, 0, 0, 1, 1, 1, 1, 1, 1, 0, 1, 0, 0, 0, 0, 0, 1, 1, 1, 0, 0, 0, 0, 1, 0, 0, 1, 0, 0]. There are 32 nonzero 1 values in this list. Each nonzero value in the list corresponds to a power $b^i$ to produce 32 polynomials generators shown in Table 2.

TABLE 2

| | | | |
|---|---|---|---|
| $c^2 + c + b$ | $c^2 + c + b^{15}$ | $c^2 + c + b^{26}$ | $c^2 + c + b^{41}$ |
| $c^2 + c + b^2$ | $c^2 + c + b^{16}$ | $c^2 + c + b^{30}$ | $c^2 + c + b^{42}$ |
| $c^2 + c + b^4$ | $c^2 + c + b^{17}$ | $c^2 + c + b^{32}$ | $c^2 + c + b^{44}$ |
| $c^2 + c + b^5$ | $c^2 + c + b^{19}$ | $c^2 + c + b^{34}$ | $c^2 + c + b^{50}$ |
| $c^2 + c + b^8$ | $c^2 + c + b^{20}$ | $c^2 + c + b^{37}$ | $c^2 + c + b^{51}$ |
| $c^2 + c + b^{10}$ | $c^2 + c + b^{21}$ | $c^2 + c + b^{38}$ | $c^2 + c + b^{52}$ |
| $c^2 + c + b^{11}$ | $c^2 + c + b^{22}$ | $c^2 + c + b^{39}$ | $c^2 + c + b^{57}$ |
| $c^2 + c + b^{13}$ | $c^2 + c + b^{25}$ | $c^2 + c + b^{40}$ | $c^2 + c + b^{60}$ |

In the 12-bit embodiment, the Galois field $GF(2^3)$ can also be generated from $GF(2)$ using a generator "A" that is a root of $A^3+A^2+1=0$. The first quadratic extension $GF(2^6)$ is calculated as follows. There are 4 $GF(2^6)$ generators over $GF(2^3)$ that correspond to all of the polynomials $B^2+B+A^i$, where trace($A^i$)=1. The values for $A^i$ are selected from the list of {trace($A^i$), i=0, . . . , 6}=[1, 1, 1, 0, 1, 0, 0]. There are 4 nonzero 1 values in this list. Each nonzero value in the list corresponds to a power $A^i$ to generate a list of 4 irreducible quadratic polynomials defined in $GF(2^3)$ as shown in Table 3.

TABLE 3

$B^2 + B + 1$
$B^2 + B + A$
$B^2 + B + A^2$
$B^2 + B + A^4$

The second quadratic extension $GF(2^{12})$ is calculated as follows. There are 32 $GF(2^{12})$ generators over $GF(2^6)$ that correspond to all of the polynomials $C^2+C+B^i$, where the trace(trace $B^i$))=1. The values for $B^i$ are selected from the list of {trace(trace($B^i$), i=0, . . . , 62}=[0, 1, 1, 0, 1, 1, 0, 0, 1, 0, 1, 1, 0, 1, 0, 1, 1, 1, 0, 1, 1, 1, 1, 0, 0, 1, 1, 0, 0, 0, 1, 0, 1, 0, 1, 0, 0, 1, 1, 1, 1, 1, 1, 0, 1, 0, 0, 0, 0, 0, 1, 1, 1, 0, 0, 0, 0, 1, 0, 0, 1, 0, 0]. There are 32 nonzero 1 values in this list. Each nonzero value in the list corresponds to a power $B^i$ to produce 32 polynomial generators shown in Table 4.

TABLE 4

| | | | |
|---|---|---|---|
| $C^2 + C + B$ | $C^2 + C + B^{15}$ | $C^2 + C + B^{26}$ | $C^2 + C + B^{41}$ |
| $C^2 + C + B^2$ | $C^2 + C + B^{16}$ | $C^2 + C + B^{30}$ | $C^2 + C + B^{42}$ |
| $C^2 + C + B^4$ | $C^2 + C + B^{17}$ | $C^2 + C + B^{32}$ | $C^2 + C + B^{44}$ |
| $C^2 + C + B^5$ | $C^2 + C + B^{19}$ | $C^2 + C + B^{34}$ | $C^2 + C + B^{50}$ |
| $C^2 + C + B^8$ | $C^2 + C + B^{20}$ | $C^2 + C + B^{37}$ | $C^2 + C + B^{51}$ |
| $C^2 + C + B^{10}$ | $C^2 + C + B^{21}$ | $C^2 + C + B^{38}$ | $C^2 + C + B^{52}$ |
| $C^2 + C + B^{11}$ | $C^2 + C + B^{22}$ | $C^2 + C + B^{39}$ | $C^2 + C + B^{57}$ |
| $C^2 + C + B^{13}$ | $C^2 + C + B^{25}$ | $C^2 + C + B^{40}$ | $C^2 + C + B^{60}$ |

In the 10-bit embodiment, the base field $GF(2)$ is first extended to $GF(2^5)$ using an irreducible primitive polynomial. $GF(2^5)$ is then extended to a quadratic extension $GF(2^{10})$ using an irreducible primitive polynomial.

In the 10-bit embodiment, there are 6 irreducible primitive polynomials that generate $GF(2^5)$. This list of 6 polynomials includes $x^5+x^2+1$; $x^5+x^3+1$; $x^5+x^3+x^2+x+1$; $x^5+x^4+x^2+x+1$; $x^5+x^4+x^3+x+1$; and $x^5+x^4+x^3+x^2+1$.

Thus, the Galois field $GF(2^5)$ can be generated from $GF(2)$ using a generator "a" that is a root of $a^5+a^2+1=0$. The quadratic extension $GF(2^{10})$ is calculated as follows. There are 16 $GF(2^{10})$ generators over $GF(2^5)$ that correspond to all of the polynomials $b^2+b+a^i$, where trace($a^i$)=1. The values for $a^i$ are selected from the list of {trace($a^i$), i=0, . . . , 30}=[1, 0, 0, 1, 0, 1, 1, 0, 0, 1, 1, 1, 1, 1, 0, 0, 0, 1, 1, 0, 1, 1, 1, 1, 0, 1, 0, 1, 0, 0, 0, 0]. There are 16 nonzero 1 values in this list. Each nonzero value in the list corresponds to a power $a^i$ to generate a list of 16 irreducible quadratic polynomials defined in $GF(2^{10})$ that are shown in Table 5.

TABLE 5

| | | | |
|---|---|---|---|
| $b^2 + b + 1$ | $b^2 + b + a^9$ | $b^2 + b + a^{13}$ | $b^2 + b + a^{21}$ |
| $b^2 + b + a^3$ | $b^2 + b + a^{10}$ | $b^2 + b + a^{17}$ | $b^2 + b + a^{22}$ |
| $b^2 + b + a^5$ | $b^2 + b + a^{11}$ | $b^2 + b + a^{18}$ | $b^2 + b + a^{24}$ |
| $b^2 + b + a^6$ | $b^2 + b + a^{12}$ | $b^2 + b + a^{20}$ | $b^2 + b + a^{26}$ |

The Galois field $GF(2^5)$ can also be generated from $GF(2)$ using a generator "a" that is a root of $a^5+a^3+1=0$. The quadratic extension $GF(2^{10})$ is calculated as follows. There are 16 $GF(2^{10})$ generators over $GF(2^5)$ that correspond to all of the polynomials $b^2+b+a^i$, where trace($a^i$)=1. The values for $a^i$ are selected from the list of {trace($a^i$), i=0, . . . , 30}=[1, 0, 0, 0, 0, 1, 0, 1, 0, 1, 1, 1, 0, 1, 1, 0, 0, 0, 1, 1, 1, 1, 1, 0, 0, 1, 1, 0, 1, 0]. There are 16 nonzero 1 values in this list. Each nonzero value in the list corresponds to a power $a^i$ to generate a list of 16 irreducible quadratic polynomials defined in $GF(2^{10})$ that are shown in Table 6.

TABLE 6

| | | | |
|---|---|---|---|
| $b^2 + b + 1$ | $b^2 + b + a^{10}$ | $b^2 + b + a^{18}$ | $b^2 + b + a^{22}$ |
| $b^2 + b + a^5$ | $b^2 + b + a^{11}$ | $b^2 + b + a^{19}$ | $b^2 + b + a^{25}$ |
| $b^2 + b + a^7$ | $b^2 + b + a^{13}$ | $b^2 + b + a^{20}$ | $b^2 + b + a^{26}$ |
| $b^2 + b + a^9$ | $b^2 + b + a^{14}$ | $b^2 + b + a^{21}$ | $b^2 + b + a^{28}$ |

The Galois field $GF(2^5)$ can also be generated from $GF(2)$ using a generator "a" that is a root of $a^5+a^3+a^2+a+1=0$. The quadratic extension $GF(2^{10})$ is calculated as follows. There are 16 $GF(2^{10})$ generators over $GF(2^5)$ that correspond to all of the polynomials $b^2+b+a^i$, where trace($a^i$)=1. The values for $a^i$ are selected from the list of {trace($a^i$), i=0, . . . , 30}=[1, 0, 0, 1, 0, 0, 0, 1, 1, 0, 0, 0, 1, 0, 1, 0, 1, 1, 0, 1, 0, 0, 0, 0, 1, 1, 1, 1, 1]. There are 16 nonzero 1 values in this list. Each nonzero value in the list corresponds to a power $a^i$ to generate a list of 16 irreducible quadratic polynomials defined in $GF(2^{10})$ that are shown in Table 7.

TABLE 7

| | | | |
|---|---|---|---|
| $b^2 + b + 1$ | $b^2 + b + a^{12}$ | $b^2 + b + a^{19}$ | $b^2 + b + a^{27}$ |
| $b^2 + b + a^3$ | $b^2 + b + a^{14}$ | $b^2 + b + a^{23}$ | $b^2 + b + a^{28}$ |
| $b^2 + b + a^6$ | $b^2 + b + a^{15}$ | $b^2 + b + a^{24}$ | $b^2 + b + a^{29}$ |
| $b^2 + b + a^7$ | $b^2 + b + a^{17}$ | $b^2 + b + a^{25}$ | $b^2 + b + a^{30}$ |

The Galois field $GF(2^5)$ can also be generated from $GF(2)$ using a generator "a" that is a root of $a^5+a^4+a^2+a+1=0$. The quadratic extension $GF(2^{10})$ is calculated as follows. There are 16 GF($2^{10}$) generators over GF($2^5$) that correspond to all of the polynomials $b^2+b+a^i$, where trace($a^i$)=1. The values for $a^i$ are selected from the list of {trace($a^i$), i=0, ..., 30}=[1, 1, 1, 0, 1, 0, 0, 0, 1, 0, 0, 1, 0, 1, 0, 1, 1, 0, 0, 0, 0, 1, 1, 1, 0, 0, 1, 1, 0, 1, 1]. There are 16 nonzero 1 values in this list. Each nonzero value in the list corresponds to a power $a^i$ to generate a list of 16 irreducible quadratic polynomials defined in GF($2^{10}$) that are shown in Table 8.

TABLE 8

| | | | |
|---|---|---|---|
| $b^2 + b + 1$ | $b^2 + b + a^8$ | $b^2 + b + a^{16}$ | $b^2 + b + a^{26}$ |
| $b^2 + b + a$ | $b^2 + b + a^{11}$ | $b^2 + b + a^{21}$ | $b^2 + b + a^{27}$ |
| $b^2 + b + a^2$ | $b^2 + b + a^{13}$ | $b^2 + b + a^{22}$ | $b^2 + b + a^{29}$ |
| $b^2 + b + a^4$ | $b^2 + b + a^{15}$ | $b^2 + b + a^{23}$ | $b^2 + b + a^{30}$ |

The Galois field GF($2^5$) can also be generated from GF(2) using a generator "a" that is a root of $a^5+a^4+a^3+a+1=0$. The quadratic extension GF($2^{10}$) is calculated as follows. There are 16 GF($2^{10}$) generators over GF($2^5$) that correspond to all of the polynomials $b^2+b+a^i$, where trace($a^i$)=1. The values for $a^i$ are selected from the list of {trace($a^i$), i=0, ..., 30}=[1, 1, 1, 0, 1, 1, 0, 0, 1, 1, 1, 0, 0, 0, 0, 1, 1, 0, 1, 0, 1, 0, 0, 1, 0, 0, 0, 1, 0, 1, 1]. There are 16 nonzero 1 values in this list. Each nonzero value in the list corresponds to a power $a^i$ to generate a list of 16 irreducible quadratic polynomials defined in GF($2^{10}$) that are shown in Table 9.

TABLE 9

| | | | |
|---|---|---|---|
| $b^2 + b + 1$ | $b^2 + b + a^5$ | $b^2 + b + a^{15}$ | $b^2 + b + a^{23}$ |
| $b^2 + b + a$ | $b^2 + b + a^8$ | $b^2 + b + a^{16}$ | $b^2 + b + a^{27}$ |
| $b^2 + b + a^2$ | $b^2 + b + a^9$ | $b^2 + b + a^{18}$ | $b^2 + b + a^{29}$ |
| $b^2 + b + a^4$ | $b^2 + b + a^{10}$ | $b^2 + b + a^{20}$ | $b^2 + b + a^{30}$ |

The Galois field GF($2^5$) can also be generated from GF(2) using a generator "a" that is a root of $a^5+a^4+a^3+a^2+1=0$. The quadratic extension GF($2^{10}$) is calculated as follows. There are 16 GF($2^{10}$) generators over GF($2^5$) that correspond to all of the polynomials $b^2+b+a^i$, where trace($a^i$)=1. The values for $a^i$ are selected from the list of {trace($a^i$), i=0, ..., 30}=[1, 1, 1, 1, 1, 0, 1, 1, 1, 0, 0, 0, 1, 0, 1, 0, 1, 1, 0, 1, 0, 0, 0, 0, 0, 1, 1, 0, 0, 1, 0, 0]. There are 16 nonzero 1 values in this list. Each nonzero value in the list corresponds to a power $a^i$ to generate a list of 16 irreducible quadratic polynomials defined in GF($2^{10}$) that are shown in Table 10.

TABLE 10

| | | | |
|---|---|---|---|
| $b^2 + b + 1$ | $b^2 + b + a^4$ | $b^2 + b + a^{12}$ | $b^2 + b + a^{19}$ |
| $b^2 + b + a$ | $b^2 + b + a^6$ | $b^2 + b + a^{14}$ | $b^2 + b + a^{24}$ |
| $b^2 + b + a^2$ | $b^2 + b + a^7$ | $b^2 + b + a^{16}$ | $b^2 + b + a^{25}$ |
| $b^2 + b + a^3$ | $b^2 + b + a^8$ | $b^2 + b + a^{17}$ | $b^2 + b + a^{28}$ |

Figure 2:
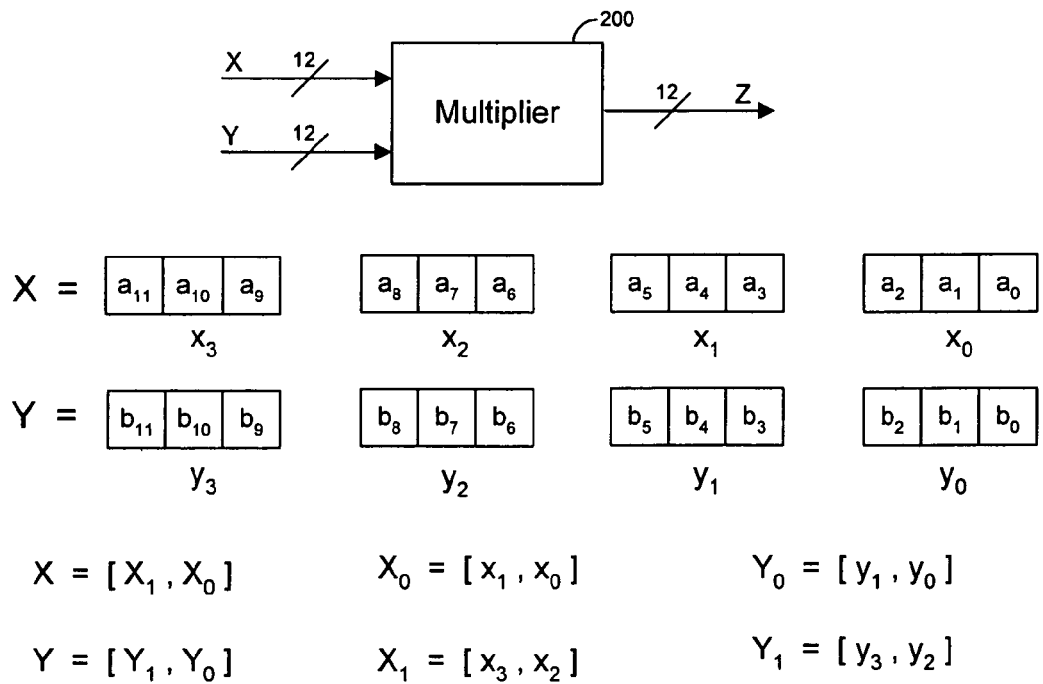
FIG. 2 illustrates a high level diagram of a 12×12 bit Galois field multiplier according to an embodiment of the present invention.

The present invention includes techniques for performing Galois field multiplication to correct errors in data stored on disks and other data storage media. FIG. 2 is a high level diagram of a Galois field multiplier according to an embodiment of the present invention. Multiplier 200 multiplies a 12-bit number X by a 12-bit number Y to obtain a 12-bit result Z using Galois field. The multiplicand X includes 12 bits $a_0$-$a_{11}$. These 12 bits are represented by four sets of 3 bits, $x_3$, $x_2$, $x_1$, and $x_0$ as shown in FIG. 2. These four sets of bits can be grouped into two sets of 6 bits, $X_0$=[$x_1$, $x_0$] and $X_1$=[$x_3$, $x_2$].

The multiplier Y includes 12 bits $b_0$-$b_{11}$. These 12 bits are represented by four sets of 3 bits, $y_3$, $y_2$, $y_1$, and $y_0$ as shown in FIG. 2. These four sets of bits can be grouped into two sets of bits, $Y_0$=[$y_1$, $y_0$] and $Y_1$=[$y_3$, $y_2$]. Further details of how multiplier 200 performs Galois field multiplication according to the present invention are described below.

Figure 3:
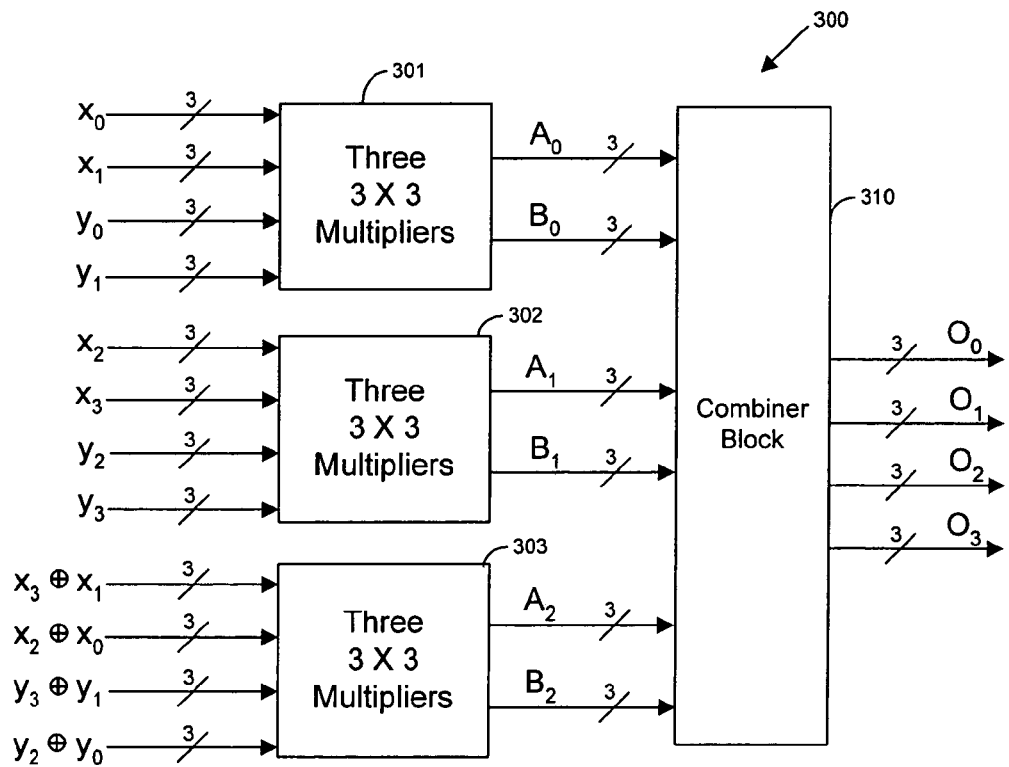
FIG. 3 illustrates a specific example of a 12×12 Galois field multiplier according to an embodiment of the present invention.

FIG. 3 illustrates a specific example of a Galois field multiplier 300 according to the present invention. Galois field multiplier 300 is a 12×12 multiplier. Galois field multiplier 300 multiplies 12-bit number X by 12-bit number Y. Galois field multiplier 300 includes three 3×3 multipliers 301-303 and a combiner block 310.

Multiplier 301 receives input bits $x_0$, $x_1$, $y_0$, and $y_1$, and generates $A_0$ and $B_0$. Multiplier 302 receives input bits $x_2$, $x_3$, $y_2$, and $y_3$, and generates $A_1$ and $B_1$. Multiplier 303 receives the results of $x_3 \oplus x_1$, $x_2 \oplus x_0$, $y_3 \oplus y_1$, and $y_2 \oplus y_0$ and generates output bits $A_2$ and $B_2$. $A_0$, $B_0$, $A_1$, $B_1$, $A_2$, and $B_2$ each have 3 bits. In the Figures, the symbol $\oplus$ indicates an XOR logic function.

Combiner block 310 receives bits $A_0$, $B_0$, $A_1$, $B_1$, $A_2$, and $B_2$ and generates 12 output bits $O_0$, $O_1$, $O_2$, and $O_3$ that represent the full result of the 12×12 Galois field multiplication. $O_0$, $O_1$, $O_2$, and $O_3$ each have 3 bits.

Figure 4A:
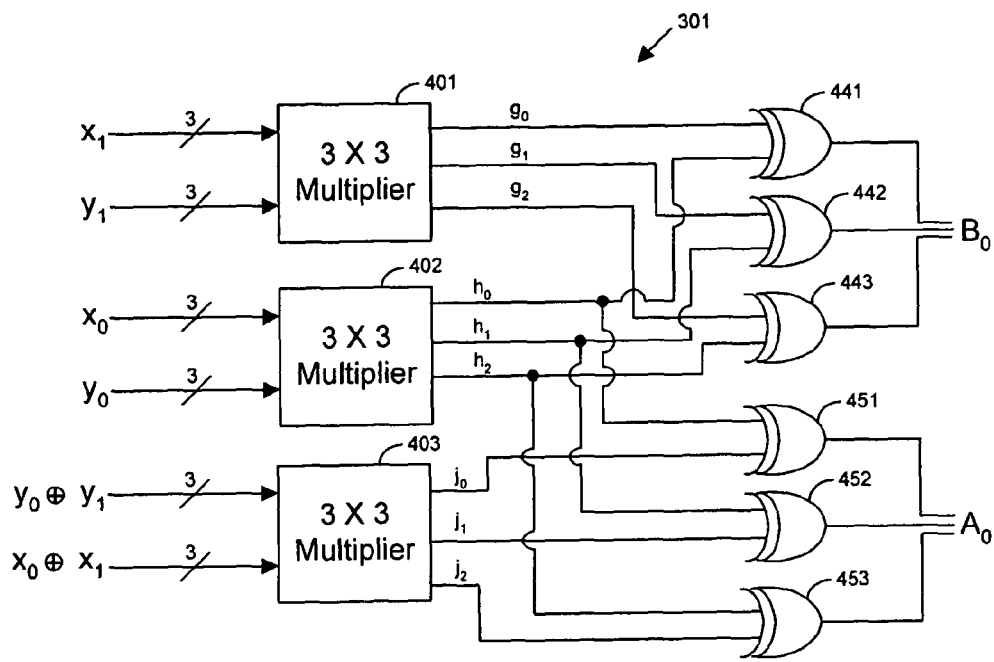
FIGS. 4A-4C illustrate examples of the three 3×3 multipliers shown in FIG. 3, according to embodiments of the present invention.
Figure 4B:
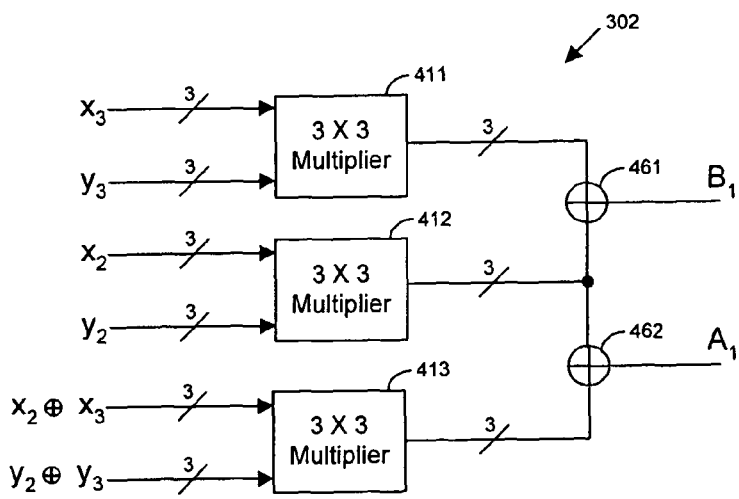
Figure 4C:
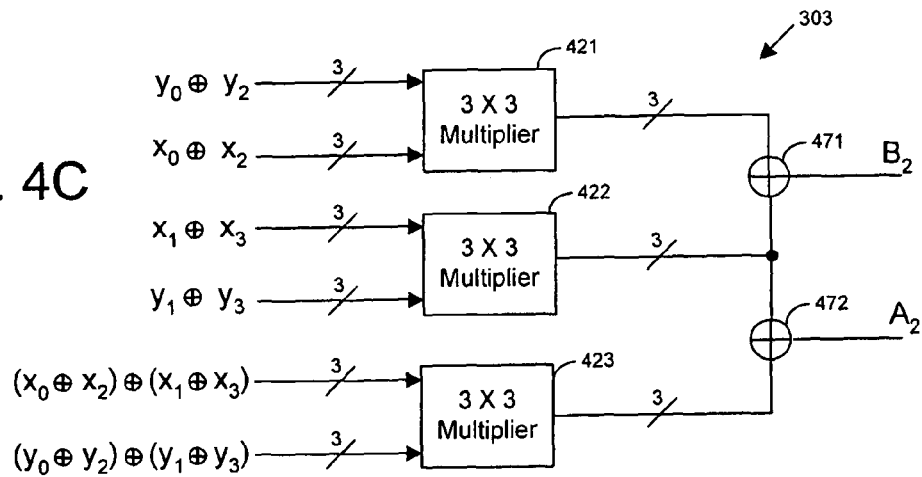

Further details of multiplier blocks 301-303 are now discussed. FIGS. 4A-4C illustrate examples of multiplier blocks 301-303, respectively, according to embodiments of the present invention. Multiplier 301 in FIG. 4A includes three 3×3 multipliers 401-403 and six exclusive OR (XOR) logic gates 441-443 and 451-453. Multiplier 401 multiplies $x_1$ (3 bits) by $y_1$ (3 bits) to generate a 3-bit result, $g_0$, $g_1$, $g_2$. Multiplier 402 multiplies $x_0$ (3 bits) by $y_0$ (3 bits) to generate a 3-bit result, $h_0$, $h_1$, $h_2$. Multiplier 403 multiplies the 3-bit result of $y_0 \oplus y_1$ by the 3-bit result of $x_0 \oplus x_1$ to generate a 3-bit result, $j_0$, $j_1$, $j_2$.

XOR gates 441-443 perform 3 respective XOR functions on the 3-bit result of multiplier 401 ($g_0$, $g_1$, $g_2$) and the 3-bit result of multiplier 402 ($h_0$, $h_1$, $h_2$) to generate a 3-bit result $B_0$, as shown in FIG. 4A. XOR gates 451-453 perform 3 respective XOR functions on the 3-bit result of multiplier 402 ($h_0$, $h_1$, $h_2$) and the 3-bit result of multiplier 403 ($j_0$, $j_1$, $j_2$) to generate a 3-bit result $A_0$, as shown in FIG. 4A.

Multiplier 302 in FIG. 4B includes three 3×3 multipliers 411-413, a first set of 3 XOR gates represented by 461, and a second set of 3 XOR gates represented by 462. Multiplier 411 multiplies $x_3$ (3 bits) by $y_3$ (3 bits) to generate a 3-bit result. Multiplier 412 multiplies $x_2$ (3 bits) by $y_2$ (3 bits) to generate a 3-bit result. Multiplier 413 multiplies the 3-bit result of $y_2 \oplus y_3$ by the 3-bit result of $x_2 \oplus x_3$ to generate a 3-bit result.

XOR gates 461 perform respective exclusive OR functions on the 3-bit output of multiplier 411 and the 3-bit output of multiplier 412 to generate a 3-bit output $B_1$. XOR gates 462 perform exclusive OR functions on the 3-bit output of multiplier 412 and the 3-bit output of multiplier 413 to generate a 3-bit output $A_1$.

Multiplier 303 in FIG. 4C includes three 3×3 multipliers 421-423, a first set of three XOR gates represented by 471, and a second set of XOR gates represented by 472. Multiplier 421 multiplies the 3-bit result of $y_0 \oplus y_2$ by the 3-bit result of $x_0 \oplus x_2$ to generate a 3-bit result. Multiplier 422 multiplies the 3-bit result of $x_1 \oplus x_3$ by the 3-bit result of $y_1 \oplus y_3$ to generate a 3-bit result. Multiplier 423 multiplies the result of a first set of XOR functions ($x_0 \oplus x_2$)$\oplus$($x_1 \oplus x_3$) by the result of a second set of XOR functions ($y_0 \oplus y_2$)$\oplus$($y_1 \oplus y_3$) to generate a 3 bit result.

XOR gates 471 perform respective exclusive OR functions on the 3-bit output of multiplier 421 and the 3-bit output of multiplier 422 to generate a 3-bit output $B_2$. XOR gates 472 perform exclusive OR functions on the 3-bit output of multiplier 422 and the 3-bit output of multiplier 423 to generate a 3-bit output $A_1$.

Figure 5A:
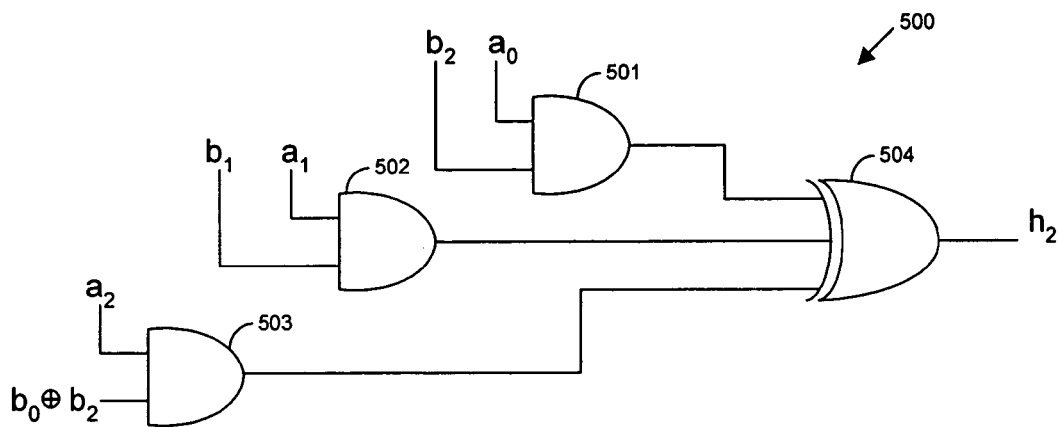
FIGS. 5A-5C illustrate an example of the 3×3 multipliers shown in FIGS. 4A-4C, according to embodiments of the present invention.
Figure 5B:
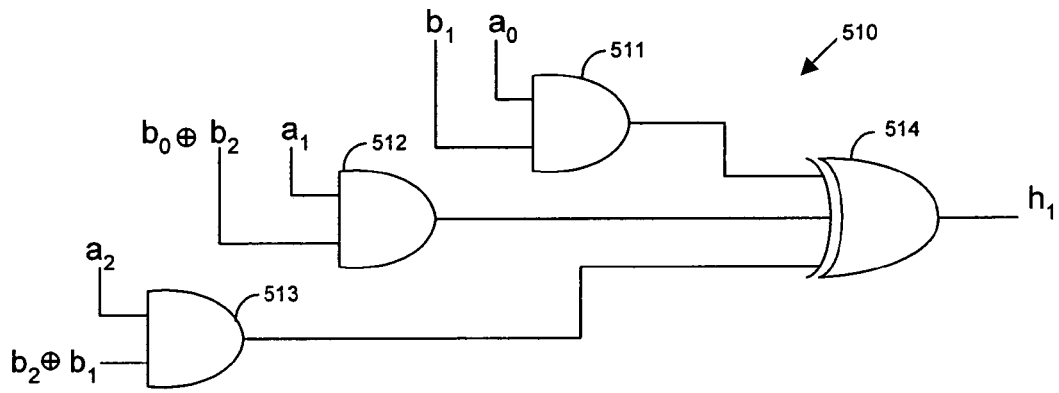
Figure 5C:
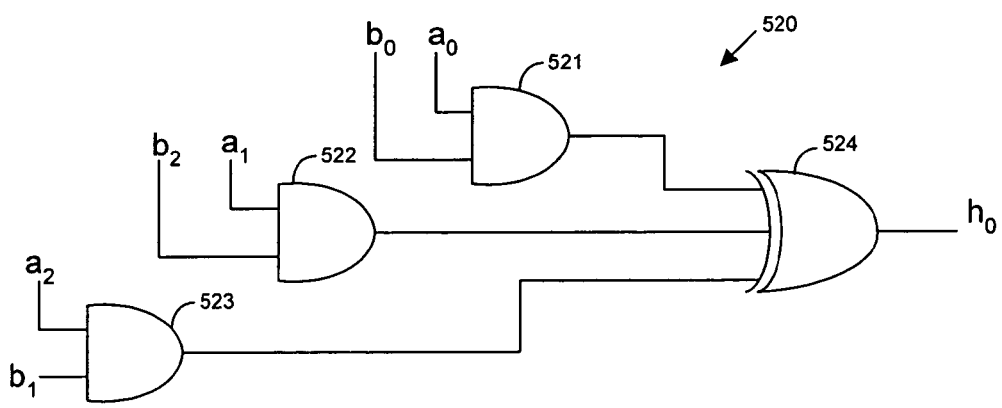

Multipliers 500, 510, and 520 shown in FIGS. 5A-5C together are an embodiment of 3×3 multiplier 402 of FIG. 4A, according to an embodiment of the present invention. Multipliers 500, 510, and 520 together perform the function of multiplier 402 by multiplying $x_0$ by $y_0$, where $x_0=[a_0, a_1, a_2]$, $y_0=[b_0, b_1, b_2]$, and $a_0-a_2$ and $b_0-b_2$ represent 6 individual bits. According to further embodiments, multipliers 500, 510, and 520 can also be used to perform the multiplication functions of 3×3 multipliers 401 and 403 by arranging the input bits accordingly.

Referring to FIG. 5A, AND gate 501 is coupled to receive bits $a_0$ and $b_2$ as inputs. AND gate 502 is coupled to receive bits $a_1$ and $b_1$ as inputs. AND gate 503 is coupled to receive bit $a_2$ and the result of $b_0 \oplus b_2$ as inputs. The outputs of AND gates 501-503 are coupled to inputs of XOR gate 504. XOR gate 504 generates output $h_2$.

Referring to FIG. 5B, AND gate 511 is coupled to receive bits $b_1$ and $a_0$ as inputs. AND gate 512 is coupled to receive bit $a_1$ and the result of $b_0 \oplus b_2$ as inputs. AND gate 513 is coupled to receive bit $a_2$ and the result of $b_0 \oplus b_1$ as inputs. The outputs of AND gates 511-513 are coupled to inputs of XOR gate 514. XOR gate 514 generates output $h_1$.

Referring to FIG. 5C, AND gate 521 is coupled to receive bits $b_2$ and $a_2$ as inputs. AND gate 522 is coupled to receive bits $a_1$ and $b_0$ as inputs. AND gate 523 is coupled to receive bits $a_0$ and $b_1$ as inputs. The outputs of AND gates 521-523 are coupled to inputs of XOR gate 524. XOR gate 524 generates output $h_2$.

Figure 6:
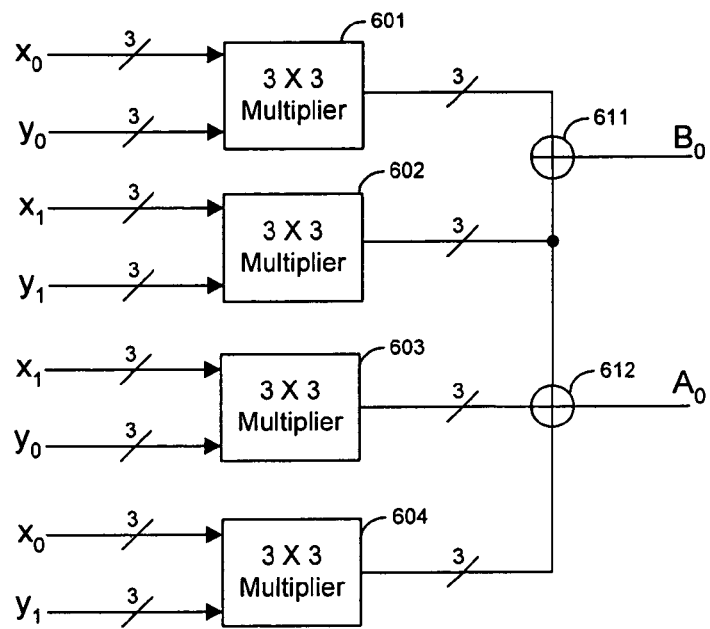
FIG. 6 illustrates four 3×3 multipliers that are an alternative to the multiplier of FIG. 4A, according to an embodiment of the present invention.

FIG. 6 illustrates a set of multipliers that are an alternative embodiment to multiplier 301 shown in FIG. 3. The embodiment of FIG. 6 includes 3×3 multiplier 601, 3×3 multiplier 602, 3×3 multiplier 603, and 3×3 multiplier 604. Multiplier 601 multiplies input bits $x_0$ by $y_0$. Multiplier 602 multiplies input bits $x_1$ by $y_1$. Multiplier 603 multiplies input bits $x_1$ by $y_0$. Multiplier 604 multiplies input bits $x_0$ by $y_1$. XOR gates 611 perform exclusive OR functions on the output bits of multipliers 601 and 602. XOR gates 612 perform exclusive OR functions on the output bits of multipliers 602-604.

The embodiment of FIG. 6 is faster (less computational latency) than multiplier 301 shown in FIG. 4A. In multiplier 301 of FIG. 4A, two XOR functions are performed on the input bits ($y_0 \oplus y_1$ and $x_0 \oplus x_1$), and the results of these XOR functions are inputted into multiplier 403. These extra XOR functions require additional computation time to perform. The embodiment of FIG. 6 does not require these extra XOR functions, and is faster as a result. However, the embodiment of FIG. 6 requires more logic gates, because it has an extra 3×3 multiplier 604. The extra multiplier 604 is performed in parallel with multipliers 601-603, and therefore, does not require additional computation time: The configuration of FIG. 6 can also be used as an alternative embodiment to multipliers 302 and 303 by rearranging the input bits accordingly.

Figure 7:
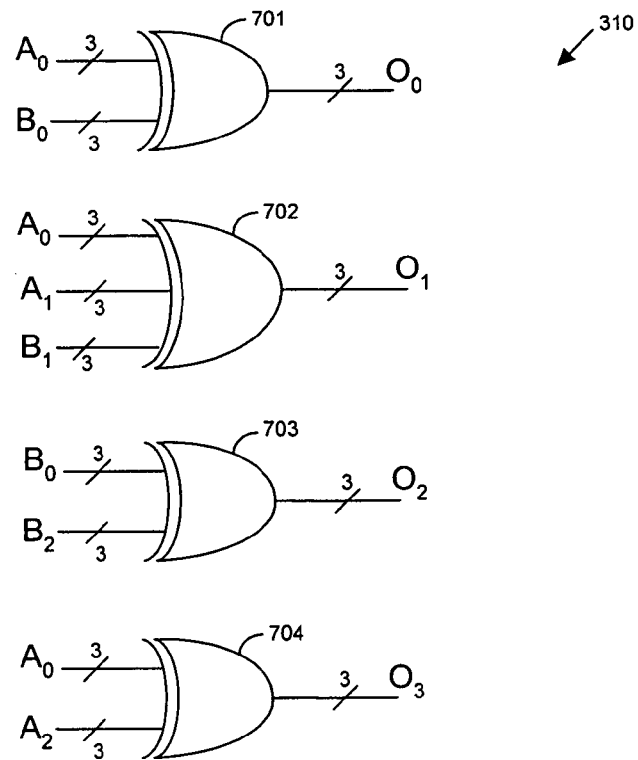
FIG. 7 illustrates an example of the combiner block shown in FIG. 3, according to an embodiment of the present invention.

FIG. 7 illustrates an embodiment of combiner block 310 shown in FIG. 3. Combiner block 310 combines the output bits $A_0-A_2$ and $B_0-B_2$ of multipliers 301-303 to generate the final output bits $O_0-O_3$. Combiner block 310 includes four XOR gates 701-704. XOR gate 701 receives input bits $A_0$ and $B_0$ and generates output bits $O_0$. XOR gate 702 receives input bits $A_0, A_1$ and $B_1$ and generates output bits $O_1$. XOR gate 703 receives input bits $B_0$ and $B_2$ and generates output bits $O_2$. XOR gate 704 receives input bits $A_0$ and $A_2$ and generates output bits $O_3$.

Figure 8:
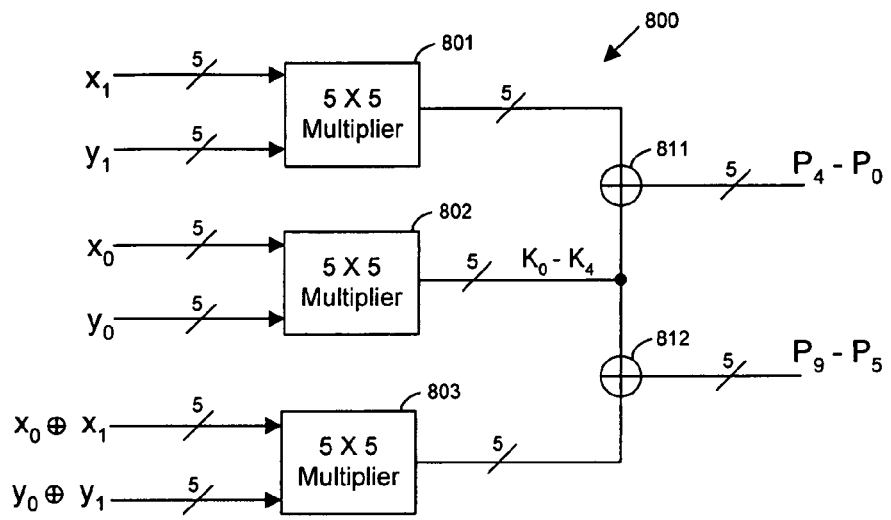
FIG. 8 illustrates a 10×10 bit Galois field multiplier according to another embodiment of the present invention.

FIG. 8 illustrates a 10-bit by 10-bit Galois field multiplier 800 according to another embodiment of the present invention. Galois field multiplier 800 multiplies a 10-bit number X by a 10-bit number Y, where $X=[x_1, x_2]$ and $Y=[y_1, y_2]$. $x_1, x_2, y_0$, and $y_1$ each have 5 bits. 5×5 multiplier 801 multiplies $x_1$ by $y_1$. 5×5 multiplier 802 multiplies $x_0$ by $y_0$. 5×5 multiplier 803 multiplies the result of $x_0 \oplus x_1$ by the result of $y_0 \oplus y_1$. XOR gates 811 perform respective exclusive OR functions on the 5 output bits of multiplier 801 and the 5 output bits of multiplier 802 to generate 5 output bits $P_0-P_4$.

XOR gates 812 performs respective exclusive OR functions on the 5 output bits of multiplier 802 and the 5 output bits of multiplier 803 to generate 5 output bits $P_5-P_9$. The embodiment of FIG. 8 has reduced complexity and reduced computational latency relative to many prior art techniques.

FIGS. 9A-9E illustrate logic gates that together are an embodiment of 5×5 multiplier 802 in FIG. 8. The logic gates of FIGS. 9A-9E multiply $x_0=[a_0, a_1, a_2, a_3, a_4]$ by $y_0=[b_0, b_1, b_2, b_3, b_4]$, where $a_0-a_4$ and $b_0-b_4$ represent 10 bits. The logic gates of FIGS. 9A-9E can also be used to implement 5×5 multipliers 801 and 803 by reassigning the appropriate bits to the inputs of the logic gates.

Figure 9A:
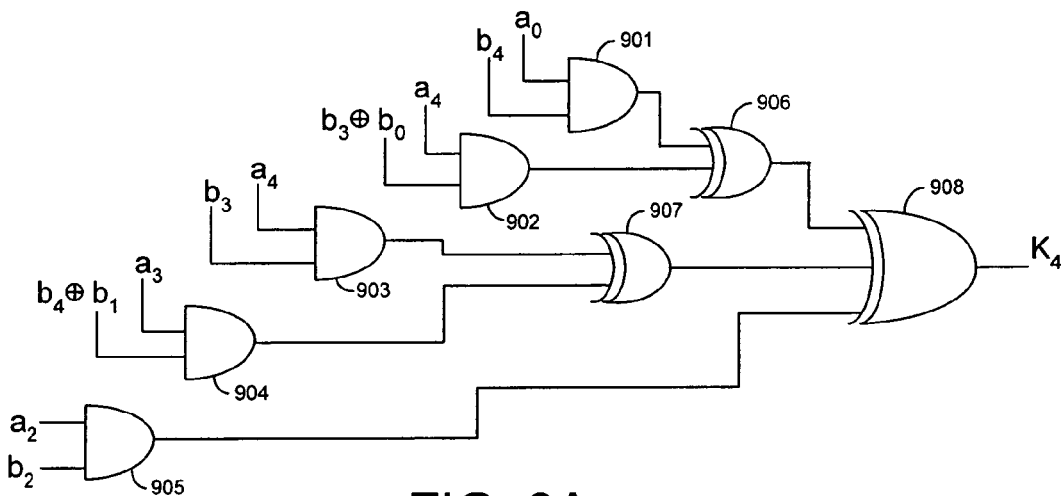
FIGS. 9A-9E illustrate logic gates that together are an embodiment of one of the 5×5 multipliers shown in FIG. 8.

Referring to FIG. 9A, AND gate 901 receives bits $b^0$ and $a_4$, AND gate 902 receives bit $a_4$ and the result of $b_0 \oplus b_3$, AND gate 903 receives bits $a_4$ and $b_3$, AND gate 904 receives bits $a_3$ and the result of $b_1 \oplus b_4$ and AND gate 905 receives bits $a_2$ and $b_2$. XOR gate 906 receives the outputs of AND gates 901 and 902, and XOR gate 907 receives the outputs of AND gates 903 and 904. XOR gate 908 receives the outputs of XOR gates 906-907 and AND gate 905. The output of XOR gate 908 is $K_4$, the first output bit of multiplier 802.

Figure 9B:
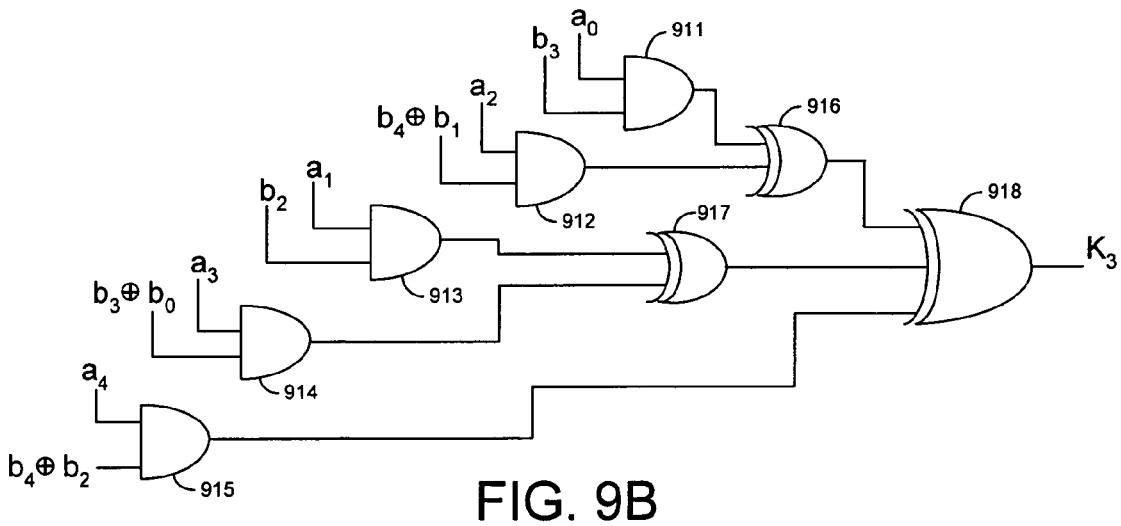

Referring to FIG. 9B, AND gate 911 receives bits $b_3$ and $a_0$, AND gate 912 receives bit $a_2$ and the result of $b_1 \oplus b_4$, AND gate 913 receives bits $a_1$ and $b_2$, AND gate 914 receives bits $a_3$ and the result of $b_0 \oplus b_3$ and AND gate 915 receives bits $a_4$ and the result of $b_4 \oplus b_2$. XOR gate 916 receives the outputs of AND gates 911 and 912, and XOR gate 917 receives the outputs of AND gates 913 and 914. XOR gate 918 receives the outputs of XOR gates 916-917 and AND gate 915. The output of XOR gate 918 is $K_3$, the second output bit of multiplier 802.

Figure 9C:
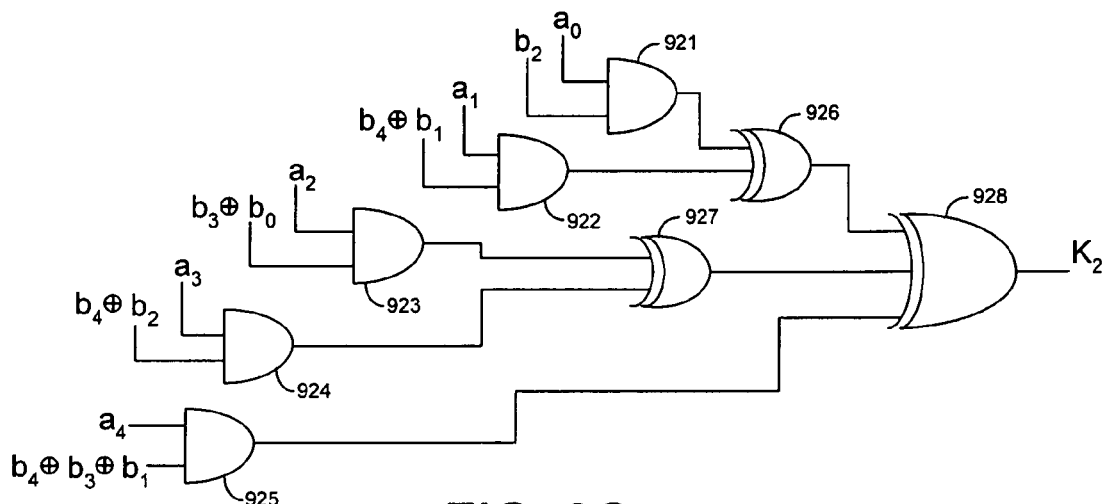

Referring to FIG. 9C, AND gate 921 receives bits $b_2$ and $a_0$, AND gate 922 receives bit $a_1$ and the result of $b_4 \oplus b_1$, AND gate 923 receives bit $a_2$ and the result of $b_3 \oplus b_0$, AND gate 924 receives bits $a_3$ and the result of $b_4 \oplus b_2$, and AND gate 925 receives bit $a_4$ and the result of $b_4 \oplus b_1 \oplus b_3$. XOR gate 926 receives the outputs of AND gates 921 and 922, and XOR gate 927 receives the outputs of AND gates 923 and 924. XOR gate 928 receives the outputs of XOR gates 926-927 and AND gate 925. The output of XOR gate 928 is $K_2$, the third output bit of multiplier 802.

Figure 9D:
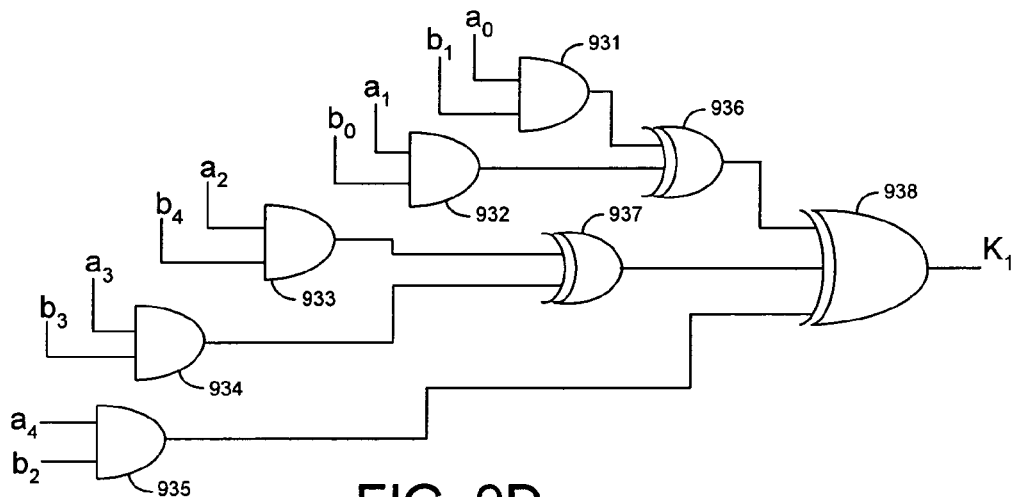

Referring to FIG. 9D, AND gate 931 receives bits $b_1$ and $a_0$, AND gate 932 receives bits $a_1$ and $b_0$, AND gate 933 receives bits $a_2$ and $b_4$, AND gate 934 receives bits $a_3$ and $b_3$, and AND gate 935 receives bits $a_4$ and $b_2$. XOR gate 936 receives the outputs of AND gates 931 and 932, and XOR gate 937 receives the outputs of AND gates 933 and 934. XOR gate 938 receives the outputs of XOR gates 936-937 and AND gate 935. The output of XOR gate 938 is $K_1$, the fourth output bit of multiplier 802.

Figure 9E:
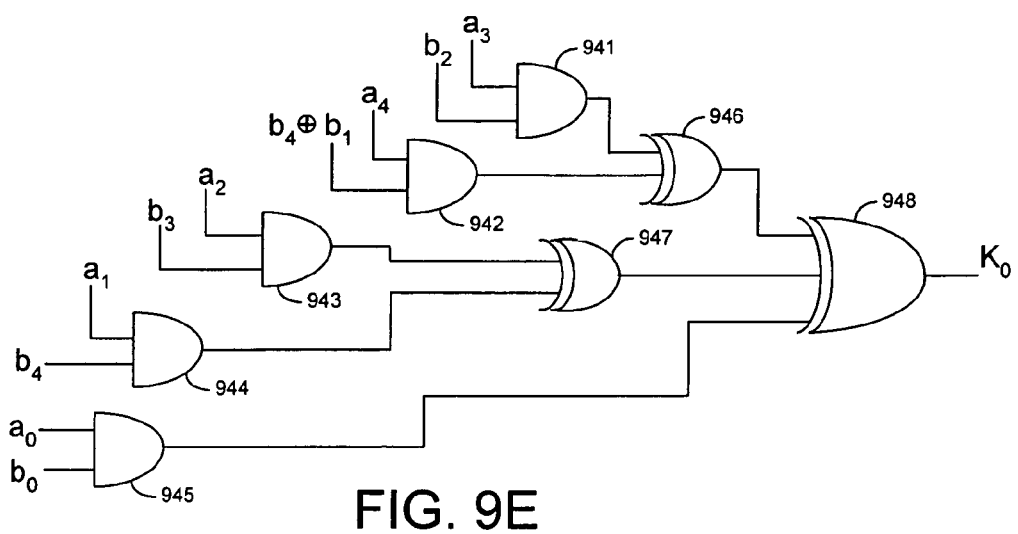

Referring to FIG. 9E, AND gate 941 receives bits $b_2$ and $a_3$, AND gate 942 receives bit $a_4$ and the result of $b_4 \oplus b_1$, AND gate 943 receives bits $a_2$ and $b_3$, AND gate 944 receives bits $a_1$ and $b_4$, and AND gate 945 receives bit $a_0$ and $b_0$. XOR gate 946 receives the outputs of AND gates 941 and 942, and XOR gate 947 receives the outputs of AND gates 943 and 944. XOR gate 948 receives the outputs of XOR gates 946-947 and AND gate 945. The output of XOR gate 948 is $K_0$, the fifth output bit of multiplier 802.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An integrated circuit having a memory and a microprocessor that performs Galois field arithmetic on 12-bit numbers read from a digital data stored on a disk, the integrated circuit comprising:

an arithmetic unit operable by the microprocessor to extend for the 12-bit numbers a base field $GF(2)$ to $GF(2^3)$ using a polynomial $a3+a+1$ over the base field $GF(2)$, wherein the arithmetic unit is operable by the microprocessor to extend for the 12-bit numbers $GF(2^3)$ to a first quadratic extension $GF(2^6)$ using a polynomial $b2+b+ai$, and values for ai are selected from a first list comprising $\{trace(ai), i=0, \ldots, 6\}=[1, 0, 0, 1, 0, 1, 1]$ wherein $trace(ai)=1$, and wherein the arithmetic unit is operable by the microprocessor to extend for the 12-bit numbers $GF(2^6)$ to a second quadratic extension $GF(2^{12})$ using a polynomial $c2+c+bi$, and values for bi are selected from a second list comprising $\{trace(trace(bi), i=0, \ldots, 62\}=[0, 1, 1, 0, 1, 1, 0, 0, 1, 0, 1, 1, 0, 1, 0, 1, 1, 1, 0, 1, 1, 1, 1, 0, 0, 1, 1, 0, 0, 0, 1, 0, 1, 0, 1, 0, 0, 1, 1, 1, 1, 1, 1, 1, 0, 1, 0, 0, 0, 0, 0, 1, 1, 1, 0, 0, 0, 0, 1, 0, 0, 1, 0, 0]$, wherein $trace(trace(bi))=1$;

wherein the values for ai and the first list produce a first set of irreducible polynomials, and the values for bi and the second list produce a second set of irreducible polynomials; and wherein the first set of irreducible polynomials and the second set of irreducible polynomials are used to detect errors in digital data stored on a disk.

2. An integrated circuit having a memory and a microprocessor that performs Galois field arithmetic on 12-bit numbers read from a digital data stored on a disk, the integrated circuit comprising:

an arithmetic unit operable by the microprocessor to extend for the 12-bit numbers a base field $GF(2)$ to $GF(2^3)$ using a polynomial $A3+A2+1$ over the base field $GF(2)$, wherein the arithmetic unit is operable by the microprocessor to extend for the 12-bit numbers $GF(2^3)$ to a first quadratic extension $GF(2^6)$ using a polynomial $B2+B+Ai$, and values for Ai are selected from a first list comprising $\{trace(Ai), i=0, \ldots, 6\}=[1, 1, 1, 0, 1, 0, 0]$ where $trace(Ai)=1$, and wherein the arithmetic unit is operable by the microprocessor to extend for the 12-bit numbers $GF(2^6)$ to a second quadratic extension $GF(2^{12})$ using a polynomial $C2+C+Bi$, and values for Bi are selected from a second list comprising $\{trace(trace(Bi), i=0, \ldots, 62\}=[0, 1, 1, 0, 1, 1, 0, 0, 1, 0, 1, 1, 0, 1, 0, 0, 1, 1, 1, 0, 1, 1, 1, 1, 0, 0, 1, 1, 0, 0, 0, 1, 0, 1, 0, 1, 0, 0, 1, 1, 1, 1, 1, 1, 1, 0, 1, 0, 0, 0, 0, 0, 1, 1, 1, 0, 0, 0, 0, 1, 0, 0, 1, 0, 0]$, wherein $trace(trace(Bi))=1$;

wherein the values for Ai and the first list produce a first set of irreducible polynomials, and the values for Bi and the second list produce a second set of irreducible polynomials; and wherein the first set of irreducible polynomials and the second set of irreducible polynomials are used to detect errors in digital data stored on a disk.

3. An integrated circuit having a memory and a microprocessor that performs Galois field arithmetic on 10-bit numbers read from a digital data stored on a disk, the integrated circuit comprising:

an arithmetic unit operable by the microprocessor to extend for the 10-bit numbers a base field $GF(2)$ to $GF(2^5)$ using an irreducible polynomial over the base field $GF(2)$, wherein the arithmetic unit is operable by the microprocessor to extend for the 10-bit numbers $GF(2^5)$ to a quadratic extension $GF(2^{10})$ using a polynomial $b2+b+ai$, and values for ai are selected from a list wherein $trace(ai)=1$;

wherein the irreducible polynomial is $a5+a2+1$, and the values for ai in the list correspond to $\{trace(ai), i=0, \ldots, 30\}=[1, 0, 0, 1, 0, 1, 1, 0, 0, 1, 1, 1, 1, 1, 0, 0, 0, 1, 1, 0, 1, 1, 1, 0, 1, 0, 1, 0, 0, 0, 0]$ wherein $trace(ai)=1$;

wherein the values for ai and the list produce a set of irreducible polynomials used to detect errors in digital data stored on a disk.

4. The integrated circuit according to claim 3 wherein the irreducible polynomial is $a5+a3+1$, and the values for ai in the list correspond to $\{trace(ai), i=0, \ldots, 30\}=[1, 0, 0, 0, 0, 1, 0, 1, 0, 1, 1, 1, 0, 1, 1, 0, 0, 0, 1, 1, 1, 1, 1, 0, 0, 1, 1, 0, 1, 0, 0]$ Wherein $trace(ai)=1$.

5. The integrated circuit according to claim 3 wherein the irreducible polynomial is $a5+a3+a2+a+1$, and the values for ai in the list correspond to $\{trace(ai), i=0, \ldots, 30\}=[1, 0, 0, 1, 0, 0, 1, 1, 0, 0, 0, 0, 1, 0, 1, 1, 0, 1, 0, 1, 0, 0, 0, 1, 1, 1, 0, 1, 1, 1, 1]$ wherein $trace(ai)=1$.

6. The integrated circuit according to claim 3 wherein the irreducible polynomial is $a5+a4+a2+a+1$, and the values for ai in the list correspond to $\{trace(ai), i=0, \ldots, 30\}=[1, 1, 1, 0, 1, 0, 0, 0, 1, 0, 0, 1, 0, 1, 0, 1, 1, 0, 0, 0, 0, 1, 1, 1, 0, 0, 1, 1, 0, 1, 1]$ wherein $trace(ai)=1$.

7. The integrated circuit according to claim 3 wherein the irreducible polynomial is $a5+a4+a3+a+1$, and the values for ai in the list correspond to $\{trace(ai), i=0, \ldots, 30\}=[1, 1, 1, 0, 1, 1, 0, 0, 1, 1, 1, 0, 0, 0, 0, 1, 1, 0, 1, 0, 1, 0, 0, 1, 0, 0, 0, 1, 0, 1, 1]$ wherein $trace(ai)=1$.

8. The integrated circuit according to claim 3 wherein the irreducible polynomial is $a5+a4+a3+a2+1$, and the values for ai in the list correspond to $\{trace(ai), i=0, \ldots, 30\}=[1, 1, 1, 1, 1, 0, 1, 1, 1, 0, 0, 0, 1, 0, 1, 0, 1, 1, 0, 1, 0, 0, 0, 0, 1, 1, 0, 0, 1, 0, 0]$ wherein $trace(ai)=1$.

* * * * *